US010925183B2

(12) United States Patent
Chiang et al.

(10) Patent No.: US 10,925,183 B2
(45) Date of Patent: Feb. 16, 2021

(54) 3D EXTENDED COOLING MECHANISM FOR INTEGRATED SERVER

(71) Applicant: ADLINK TECHNOLOGY INC., New Taipei (TW)

(72) Inventors: Hsuan-Chan Chiang, New Taipei (TW); Guan-Yi Wang, New Taipei (TW); Jen-Chieh Huang, New Taipei (TW)

(73) Assignee: ADLINK TECHNOLOGY INC., New Taipei (TW)

( * ) Notice: Subject to any disclaimer, the term of this patent is extended or adjusted under 35 U.S.C. 154(b) by 185 days.

(21) Appl. No.: 16/281,345

(22) Filed: Feb. 21, 2019

(65) Prior Publication Data

US 2020/0275584 A1  Aug. 27, 2020

(51) Int. Cl.
*H05K 7/20* (2006.01)

(52) U.S. Cl.
CPC ..... *H05K 7/20736* (2013.01); *H05K 7/20145* (2013.01); *H05K 7/20154* (2013.01); *H05K 7/20272* (2013.01); *H05K 7/20781* (2013.01)

(58) Field of Classification Search
CPC .......... H05K 7/20145; H05K 7/20154; H05K 7/20172; H05K 7/202; H05K 7/20254; H05K 7/20263; H05K 7/20272; H05K 7/20327; H05K 7/20536; H05K 7/20554; H05K 7/20563; H05K 7/20572; H05K 7/20609; H05K 7/207; H05K 7/20736; H05K 7/20836; H05K 7/20781; H05K 7/20727; H05K 7/20772; H05K 7/20636;

(Continued)

(56) References Cited

U.S. PATENT DOCUMENTS 6,430,042 B1 * 8/2002 Ohashi ............... G06F 1/203
                                                 165/104.33
6,437,979 B1 * 8/2002 Unrein ............... G06F 1/181
                                                 165/185

(Continued)

FOREIGN PATENT DOCUMENTS

EP         2685799 A2 *  1/2014  ......... H05K 7/20727
WO  WO-2013066796 A1 *  5/2013  ......... H05K 7/20727

*Primary Examiner* — Jianying C Atkisson
*Assistant Examiner* — Jose O Class-Quinones
(74) *Attorney, Agent, or Firm* — Muncy, Geissler, Olds & Lowe, P.C.

(57) ABSTRACT

A 3D extended cooling mechanism includes cabinet, air intake module, heat exchange module including heat exchanger, air baffle and bottom plate, first wind tunnel defined above the air baffle, second wind tunnel defined between air baffle and bottom plate and third wind tunnel defined between bottom plate and bottom of cabinet. First, second and third wind tunnels accept the air drawn by air intake module to form a respective cold air stream. Heat exchanger accepts cold air stream of first wind tunnel for heat exchange, enabling hot air produced in heat exchange to be delivered to air outlet of cabinet for discharge. First, second, and third wind tunnels are designed to dissipate the relatively low temperature airflow into high temperature sensitive heat source components in the longitudinal direction and the lateral direction so that heat source elements can be efficiently dissipated at the same time to achieve three-dimensional expansion cooling.

10 Claims, 6 Drawing Sheets

(58) Field of Classification Search
CPC ........ H05K 7/20754; F28D 2021/0028; F28D 2021/0029; F28D 2021/0031
See application file for complete search history.

(56) References Cited

U.S. PATENT DOCUMENTS

| | | | | |
|---|---|---|---|---|
| 6,504,718 B2* | 1/2003 | Wu | ................... | H05K 7/20727 165/104.33 |
| 6,597,569 B1* | 7/2003 | Unrein | ................... | G06F 1/181 361/679.4 |
| 7,408,773 B2* | 8/2008 | Wobig | ................... | G06F 1/20 165/104.33 |
| 9,578,786 B1* | 2/2017 | Beall | ................... | H05K 7/20754 |
| 9,907,207 B1* | 2/2018 | Wu | ................... | H05K 7/20272 |
| 2002/0098792 A1* | 7/2002 | Hsiao | ................... | H05K 7/20172 454/184 |
| 2002/0117291 A1* | 8/2002 | Cheon | ................... | G06F 1/20 165/80.4 |
| 2002/0142646 A1* | 10/2002 | Huang | ................... | H05K 7/20172 439/485 |
| 2003/0002256 A1* | 1/2003 | Tano | ................... | H05K 7/20154 361/694 |
| 2003/0156385 A1* | 8/2003 | Askeland | ................... | G06F 1/182 361/679.51 |
| 2005/0041392 A1* | 2/2005 | Chen | ................... | H05K 7/20727 361/695 |
| 2005/0088820 A1* | 4/2005 | Naganawa | ................... | F28F 9/0246 361/697 |
| 2005/0113016 A1* | 5/2005 | Shen | ................... | G06F 1/20 454/184 |
| 2005/0128710 A1* | 6/2005 | Beitelmal | ................... | H01L 23/3675 361/709 |
| 2005/0141993 A1* | 6/2005 | Hung | ................... | F04D 29/582 415/213.1 |
| 2005/0168938 A1* | 8/2005 | Bash | ................... | H05K 7/20772 361/679.48 |
| 2005/0231910 A1* | 10/2005 | Malone | ................... | H05K 7/20772 361/695 |
| 2005/0231913 A1* | 10/2005 | Malone | ................... | H05K 7/20727 361/698 |
| 2005/0241799 A1* | 11/2005 | Malone | ................... | G06F 1/20 165/80.1 |
| 2005/0241802 A1* | 11/2005 | Malone | ................... | H05K 7/20736 165/80.4 |
| 2005/0252638 A1* | 11/2005 | Hung | ................... | H01L 23/467 165/80.3 |
| 2006/0109624 A1* | 5/2006 | Hung | ................... | H05K 7/20727 361/694 |
| 2006/0249278 A1* | 11/2006 | Liu | ................... | H01L 23/473 165/80.4 |
| 2007/0012427 A1* | 1/2007 | Liu | ................... | H01L 23/427 165/104.26 |
| 2007/0064387 A1* | 3/2007 | Matsumoto | ................... | H05K 7/20154 361/690 |
| 2007/0076370 A1* | 4/2007 | Mongia | ................... | H01L 23/467 361/690 |
| 2007/0125523 A1* | 6/2007 | Bhatti | ................... | H05K 7/20772 165/104.33 |
| 2007/0163270 A1* | 7/2007 | Chien | ................... | F25B 21/02 62/3.3 |
| 2007/0183126 A1* | 8/2007 | Tilton | ................... | H01L 23/4735 361/699 |
| 2008/0117589 A1* | 5/2008 | Carrera | ................... | G06F 1/20 361/679.51 |
| 2008/0204996 A1* | 8/2008 | Sun | ................... | H05K 7/20727 361/694 |
| 2008/0232066 A1* | 9/2008 | Wu | ................... | H05K 7/20727 361/690 |
| 2008/0239661 A1* | 10/2008 | McClellan | ................... | H05K 7/20154 361/690 |
| 2008/0239688 A1* | 10/2008 | Casey | ................... | H05K 7/207 361/796 |
| 2009/0016037 A1* | 1/2009 | Chen | ................... | G06F 1/185 361/810 |
| 2009/0059516 A1* | 3/2009 | Lai | ................... | G06F 1/20 361/679.48 |
| 2010/0073872 A1* | 3/2010 | Pakravan | ................... | H05K 7/20572 361/695 |
| 2010/0181886 A1* | 7/2010 | Hsu | ................... | F21V 29/76 313/45 |
| 2011/0058330 A1* | 3/2011 | Abraham | ................... | G06F 1/20 361/679.47 |
| 2011/0182024 A1* | 7/2011 | Nihashi | ................... | G06F 1/20 361/679.33 |
| 2011/0273840 A1* | 11/2011 | Chen | ................... | H05K 7/20727 361/679.48 |
| 2011/0299240 A1* | 12/2011 | Kimura | ................... | G06F 1/20 361/679.49 |
| 2012/0026686 A1* | 2/2012 | Suzuki | ................... | G06F 1/206 361/689 |
| 2012/0044634 A1* | 2/2012 | Huang | ................... | G06F 1/20 361/679.49 |
| 2012/0293944 A1* | 11/2012 | Yi | ................... | H05K 7/1487 361/679.32 |
| 2012/0325432 A1* | 12/2012 | Fan | ................... | G06F 1/20 165/67 |
| 2013/0111937 A1* | 5/2013 | Hendrix | ................... | G06F 1/20 62/127 |
| 2013/0155614 A1* | 6/2013 | Lin | ................... | H05K 7/20563 361/695 |
| 2013/0160984 A1* | 6/2013 | Cash | ................... | F28F 27/00 165/200 |
| 2013/0170138 A1* | 7/2013 | Fujii | ................... | H05K 7/20572 361/695 |
| 2014/0098493 A1* | 4/2014 | Chen | ................... | H05K 7/20145 361/692 |
| 2014/0146471 A1* | 5/2014 | Liu | ................... | H05K 7/20727 361/695 |
| 2014/0233183 A1* | 8/2014 | Horng | ................... | G06F 1/203 361/692 |
| 2015/0153792 A1* | 6/2015 | Chen | ................... | F25D 23/12 361/679.47 |

* cited by examiner

3D EXTENDED COOLING MECHANISM FOR INTEGRATED SERVER

BACKGROUND OF THE INVENTION

1. Field of the Invention

The present invention relates to integrated server technology and more particularly, to a 3D extended cooling mechanism for integrated server, which consists of a cabinet, an air intake module and at least one heat exchange module for effectively cooling a plurality of heat source elements at the same time.

2. Description of the Related Art

The operating speed of industrial computer servers increases rapidly with the progress of the processor, memory and busbars. Therefore, the temperature inside the server cabinet is high. In order to effectively discharge the high temperature out of the cabinet, it is well known to install various heat dissipating devices (such as fans and heat sinks) in the cabinet. In particular, industrial computer servers often need to be densely arranged in a limited space environment, so the accumulated temperature in the environment is not easy to diverge. In the face of a harsh heat dissipation environment, the heat dissipating device in the industrial computer server needs to work more efficiently to maximize heat dissipation in a limited space.

Further, industrial computer servers are the most important part of automated production equipment. All control processes are controlled by computer servers, so computer servers need to be turned on all the time. Therefore, the stability requirements for computer servers are naturally much higher than those of general home computers. In the event of a downtime, the company will certainly have a big loss. With respect to the stability of the computer server, how to effectively solve the internal heating problems such as the central processing unit, the access device, the interface card and the power supply is the key.

Most of the low-end server cabinets in the market are not cooled by a heat flow field. They simply use the internal fans to directly vent the air in the direction of the air outlet. The air flow field inside the cabinet is chaotic, and the pressure resistance caused by the eddy current is increased, making the fan output air volume low, which leads to the continuous accumulation of thermal energy, so that the temperature inside the system continues to rise. Therefore, how to plan and design a cooling device for generating a heat dissipation flow field to cool multiple temperature sensitive heat source components is the problem to be solved by the present invention.

SUMMARY OF THE INVENTION

The present invention has been accomplished under the circumstances in view. It is therefore one object of the present invention to provide a 3D extended cooling mechanism, which comprises a cabinet, an air intake module and at least one heat exchange module. The heat exchange module comprises a heat exchanger, an air baffle and a bottom plate. A first wind tunnel is defined above the air baffle. A second wind tunnel is defined between the air baffle and the bottom plate. A third wind tunnel is defined between the bottom plate and the bottom of the cabinet. The first, second and third wind tunnels accept the air drawn by the air intake module to form a respective cold air stream. The heat exchanger accepts the cold air stream of the first wind tunnel for heat exchange, enabling the hot air produced in heat exchange to be delivered to the air outlet of the cabinet for discharge. The first, second, and third wind tunnels are designed to dissipate the relatively low temperature airflow into high temperature sensitive heat source components in the longitudinal direction and the lateral direction so that the heat source elements can be efficiently dissipated at the same time to achieve three-dimensional expansion cooling.

Preferably, the heat exchange module further comprises a pump that has a connecting pipe connected to the heat exchanger. The thermal-conductive device is connected to the pump. The pump drives the heat transfer medium to flow in the pump, the thermal-conductive device and the heat exchanger to lower the operating temperature of heat source elements.

Other advantages and features of the present invention will be fully understood by reference to the following specification in conjunction with the accompanying drawings, in which like reference signs denote like components of structure.

DETAILED DESCRIPTION OF THE PREFERRED EMBODIMENT

Referring to FIGS. 1-6, an elevational view of a 3D extended cooling mechanism for integrated server in accordance with the present invention, another elevational view of the 3D extended cooling mechanism, an exploded view of the 3D extended cooling mechanism, another exploded view of the 3D extended cooling mechanism, a sectional side view of the 3D extended cooling mechanism and another sectional side view of the 3D extended cooling mechanism are shown. The 3D extended cooling mechanism comprises a cabinet 1, an air intake module 2, at least one heat exchange module 3, a first heat source element 41, a second heat source element 51 and a third heat source element 6. Each component is described in detail as follows:

The cabinet 1 comprises an air inlet 11, an air outlet 12, a wind guide 13 and at least one bracket 14.

The air intake module 2 is fixedly mounted in the air inlet 11 of the cabinet 1 for drawing outside air into the cabinet 1. The wind guide 13 is mounted inside the cabinet 1 to support the air intake module 2, comprising at least one air guide hole 130 and two oblique guide plates 131 at each air guide hole 130. The two oblique guide plates 131 are respectively obliquely extended from opposing top and bottom surfaces of the wind guide 13, each presenting a guide angle, or disposed parallel manner to each other for guiding the air being drawn by the air intake module 2 to a third wind tunnel 23.

The air intake module 2 is composed of a plurality of fans that are arranged in two rows at two opposite sides of the air guide holes 130 of the wind guide 13.

The at least one heat exchange module 3 is fixedly mounted in the cabinet 1, each comprising a heat exchanger 31, an air baffle 32 and a bottom plate 33. A first wind tunnel 21 is defined above the air baffle 32. A second wind tunnel 22 is defined between the air baffle 32 and the bottom plate 33. The aforesaid third wind tunnel 23 is defined between the bottom plate 33 and a bottom wall of the cabinet 1. The first, second and third wind tunnels (21,22,23) receive the intake air from the air intake module 2 to produce a respective cold air stream. The heat exchanger 31 receives the cold air stream from the first wind tunnel 21 for heat exchange. The heat exchanger 31 transmits the hot air generated in the heat exchange process to the air outlet 12 of the cabinet 1.

The bottom plate 33 of the heat exchange module 3 has at least one diversion hole 330 for guiding a part of the cold air stream from the second wind tunnel 22 to the third wind tunnel 23.

The air baffle 32 and bottom plate 33 of each heat exchange module 3 are respectively provided with a plurality of wind splitters 331.

The wind splitters 331 transversely cut the cold air stream of the second wind tunnel 22 and direct each lateral cold air stream to focus on the second heat source element 51 for heat dissipation. For example, if the number of the second heat source elements 51 is three, the wind splitters 331 divide the second wind tunnel 22 into three concentrated wind tunnels corresponding to positions of the second heat source elements 51 for better heat dissipation. The arrangement of the wind splitters 331 is determined subject to the number and position of the second heat source element 51 to optimize heat dissipation efficiency.

The heat exchanger 31 is a plate-fin heat exchanger that define therein a plurality of flow paths (not shown) for a heat transfer medium (not shown) to flow in for heat exchange. The heat transfer medium consists of pure water or a composite component of water-cooled liquid. However, this is only one of the implementation members listed in the present invention, and those skilled in the art may also use a heat pipe as a component of the heat exchanger 31, and the heat transfer medium can be general air or a specific component gas that can also achieve the heat exchange function. The use of a heat pipe as an implementation component of the heat exchanger 31 is still within the scope of the present invention.

The at least one bracket 14 is mounted in the cabinet 1 for the hanging of the at least one heat exchange module 3. In this embodiment, two the brackets 14 are provided for the mounting of the at least one heat exchange module 3. However, the number of brackets 14 is not important, and the arrangement of two brackets 14 is not a limitation.

Each heat exchange module 3 further comprises a pump 35 mounted on the air baffle 32. In this embodiment, the pump 35 is a liquid pump. The pump 35 has a connecting pipe 351 connected to the heat exchanger 31. Further, a thermal-conductive device 34 is connected to the pump 35. The pump 35 drives the heat transfer medium to flow in the pump 35, the thermal-conductive device 34 and the heat exchanger 31 to reduce the operating temperature of the first heat source element 41.

The first heat source element 41 is mounted on a first motherboard 4 of a bottom side of the cabinet 1. The first motherboard 4 has a plurality of memory modules 42 mounted thereon that accept the cooling of the cold air stream of the third wind tunnel 23. Further, the aforesaid thermal-conductive device 34 is mounted between the first heat source element 41 and the heat exchanger 31 of each heat exchange module 3. The thermal-conductive device 34 comprises a cryogenic tube 341, a high temperature tube 342, and a thermal cover 343 attached to the surface of the first heat source element 41. Heat generated by the first heat source element 41 is carried by a heat transfer medium in the high temperature tube 342 of the thermal-conductive device 34 to the heat exchanger 31 for heat exchange. The low-temperature heat transfer medium outputted by the heat exchanger 31 is delivered back to the first heat source element 41 by the cryogenic tube 341 of the thermal-conductive device 34 and the thermal cover 343 to lower the operating temperature of the first heat source element 41. The first heat source element 41 refers to at least one central processing unit (CPU) that has a radiation fin 411 arranged thereon. The radiation fin 411 has a top side thereof disposed in contact with the thermal cover 343 so that the central processing unit (CPU) can transfer its heat energy to the thermal cover 343 for heat exchange by the thermal-conductive device 34.

The second heat source element 51 is inserted into a slot of a second motherboard 5 in the cabinet 1 to accept the cold air stream of the second wind tunnel 22 for cooling. The hot air flowing through the second heat source element 51 is sent to the air outlet 12 of the cabinet 1 for discharge. The second heat source element 51 refers to at least one interface card. The interface card is, for example, a GPU card that is easy to generate heat. Of course, the present invention is not limited by itself, and other interface cards that are prone to heat can be used as an implementation component of the second heat source element 51.

The third heat source element 6 is mounted on the bottom of the cabinet 1 to accept the air flowing in the third wind tunnel 23 through the first heat source element 41 for cooling. The hot air flowing through the third heat source element 6 is sent to the air outlet 12 of the cabinet 1 for discharge. The third heat source element 6 refers to at least one power supply.

To assemble the 3D extended cooling mechanism of the present invention, first set the first motherboard 4 on the bottom of the cabinet 1. The first motherboard 4 includes at least one first heat source element 41 (CPU) and the plurality of memory modules 42. Then, mount the third heat source element 6 (power supply) on the bottom of the cabinet 1, and then mount the second motherboard 5 on a top side of the third heat source element 6. The second motherboard 5 has a plurality of slots (not shown) for the mounting of the at least one second heat source element 51 (interface card). Then, affix the wind guide 13 to cabinet 1, and then fixedly mount the air intake module 2 (a plurality of fans) to the wind guide 13. Then, connect the at least one heat exchange module 3, the thermal-conductive device 34 and the first heat source element 41 at the first motherboard 4 together, and then affix the top side of the body of the heat exchange module 3 to the at least one bracket 14, and then affix the at least one bracket 14 to the cabinet 1 to complete the installation.

Figure 1:
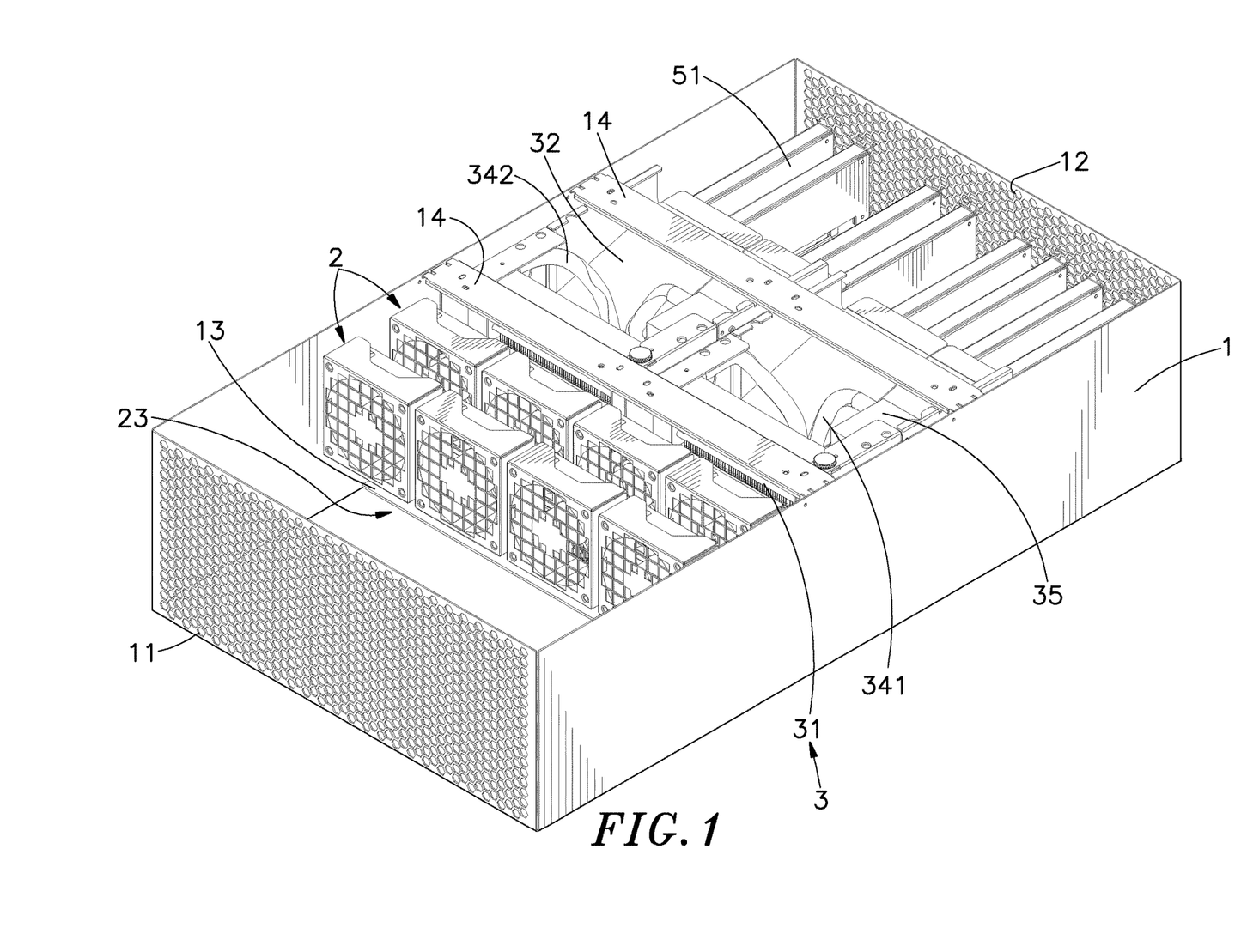
FIG. 1 is an oblique top elevational view of a 3D extended cooling mechanism in accordance with the present invention.
Figure 2:
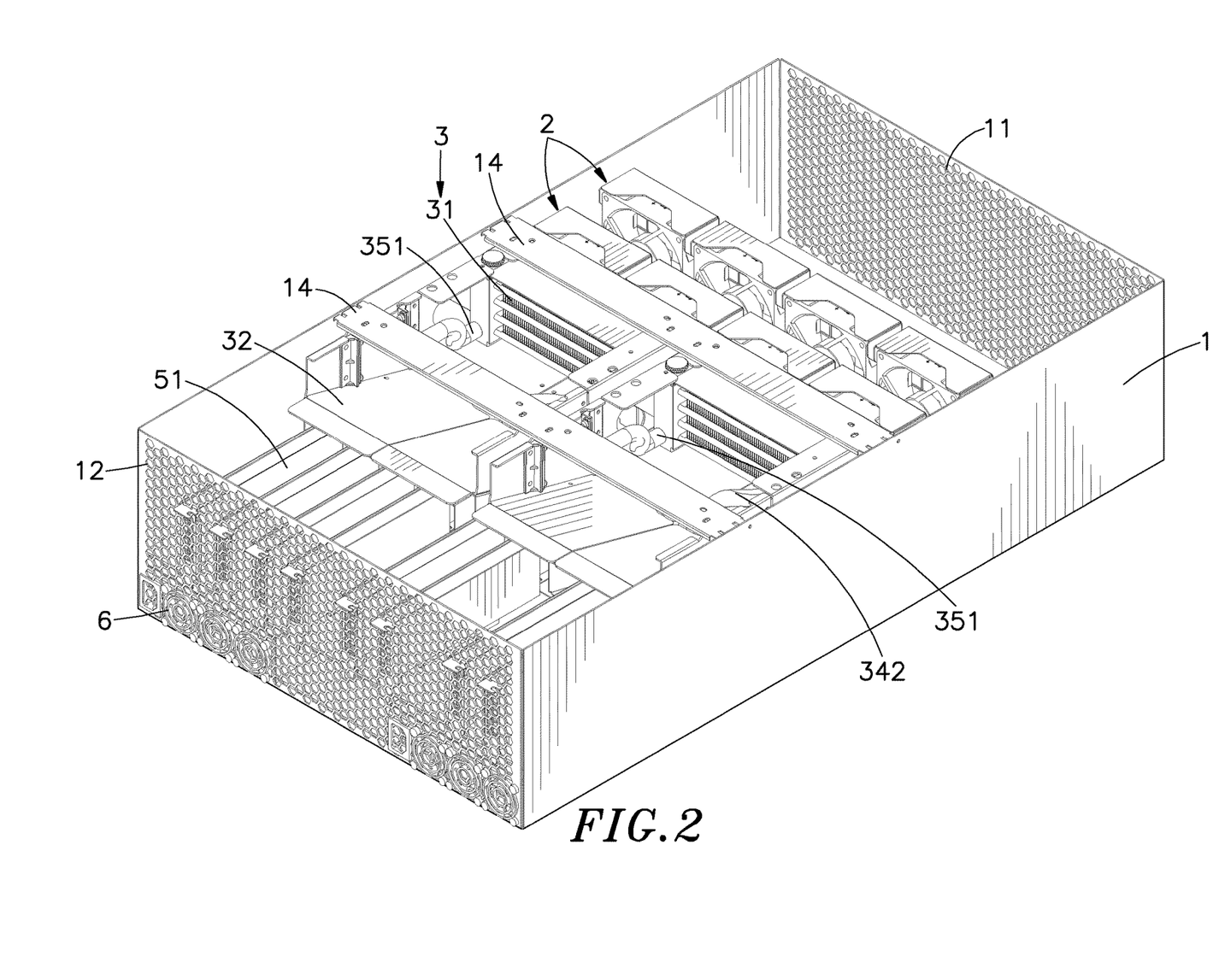
FIG. 2 corresponds to FIG. 1 when viewed from another angle.
Figure 3:
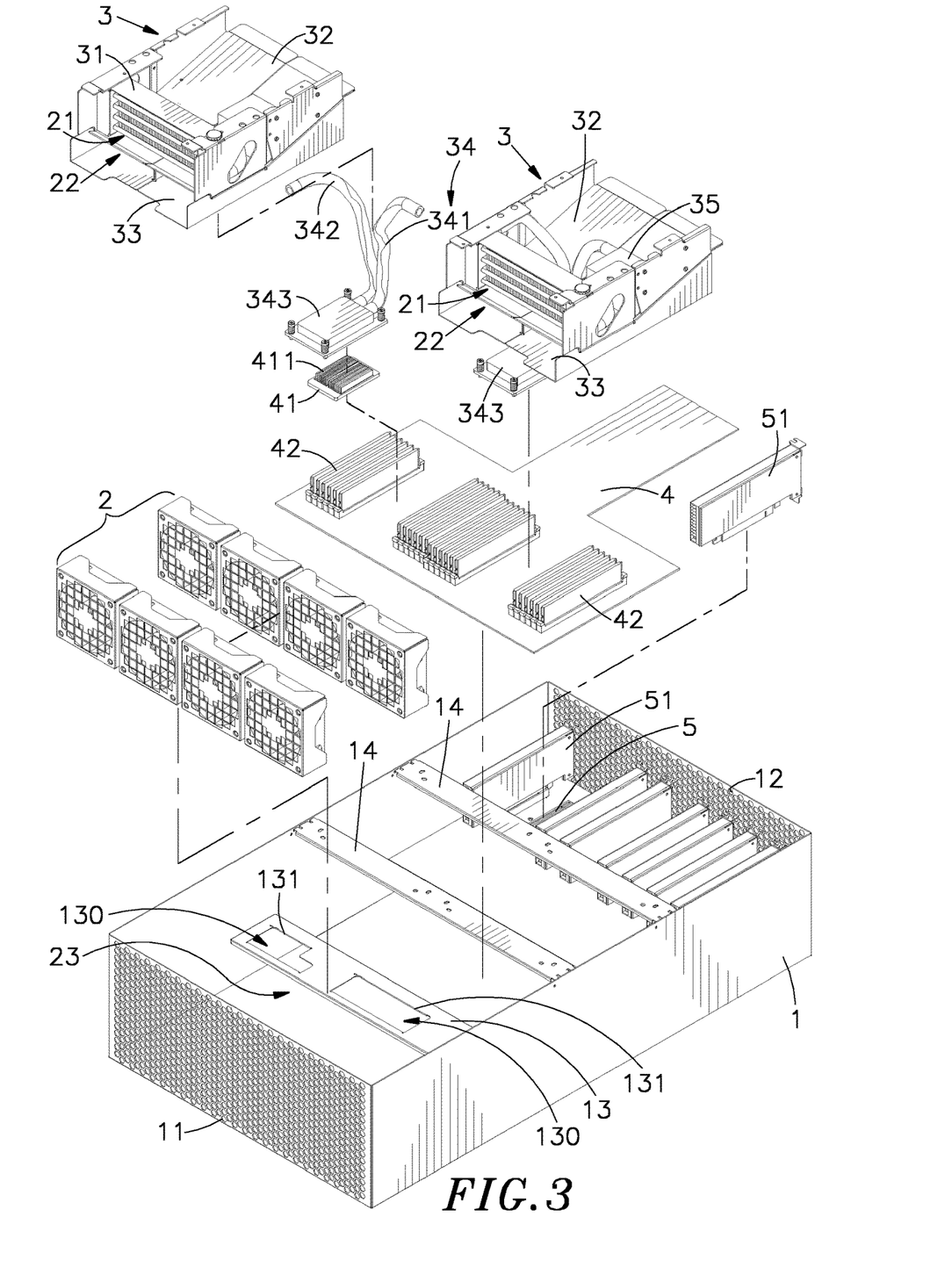
FIG. 3 is an exploded view of the 3D extended cooling mechanism in accordance with the present invention.
Figure 4:
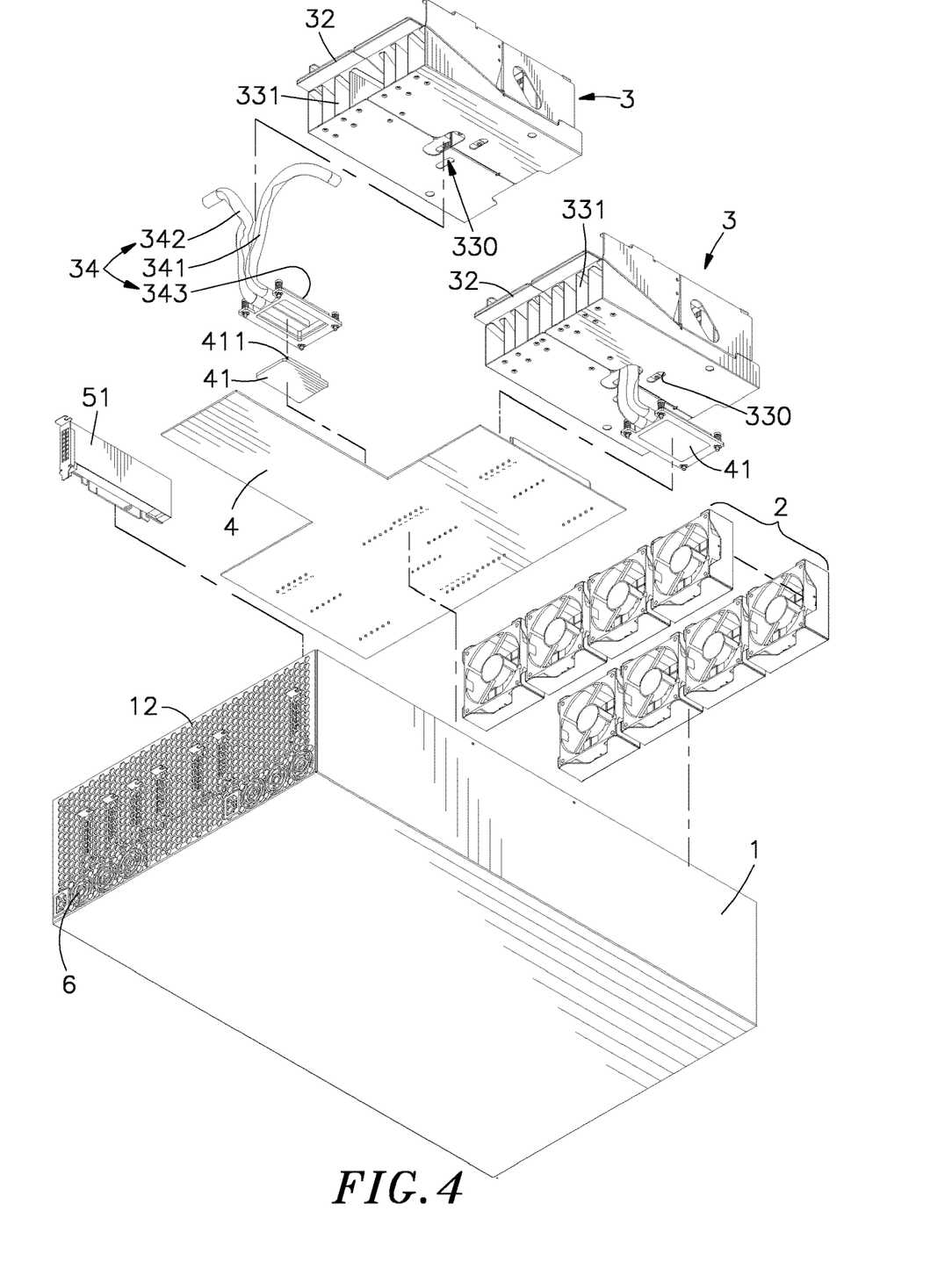
FIG. 4 is another exploded view of the 3D extended cooling mechanism in accordance with the present invention.
Figure 5:
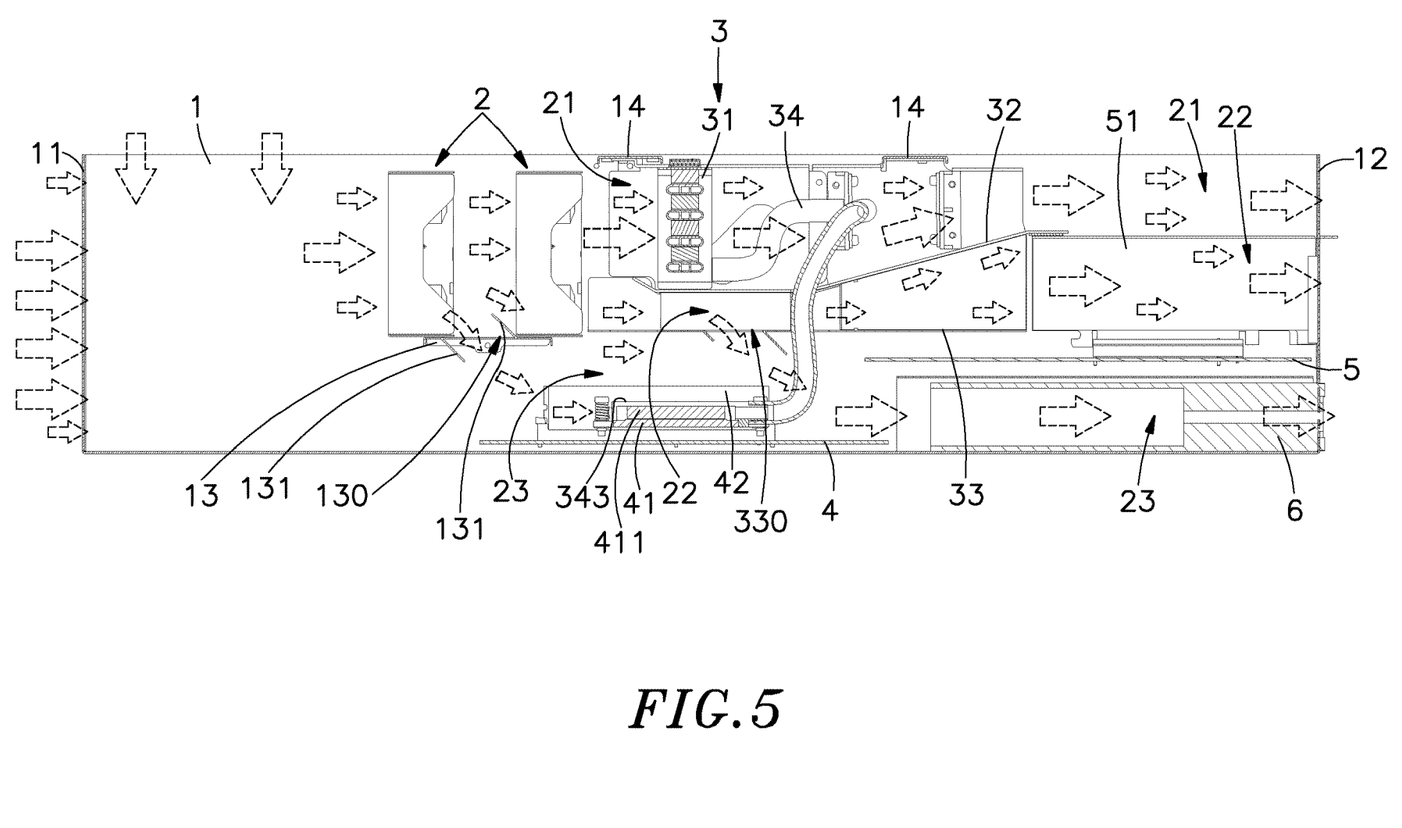
FIG. 5 is a sectional side view of the 3D extended cooling mechanism in accordance with the present invention.
Figure 6:
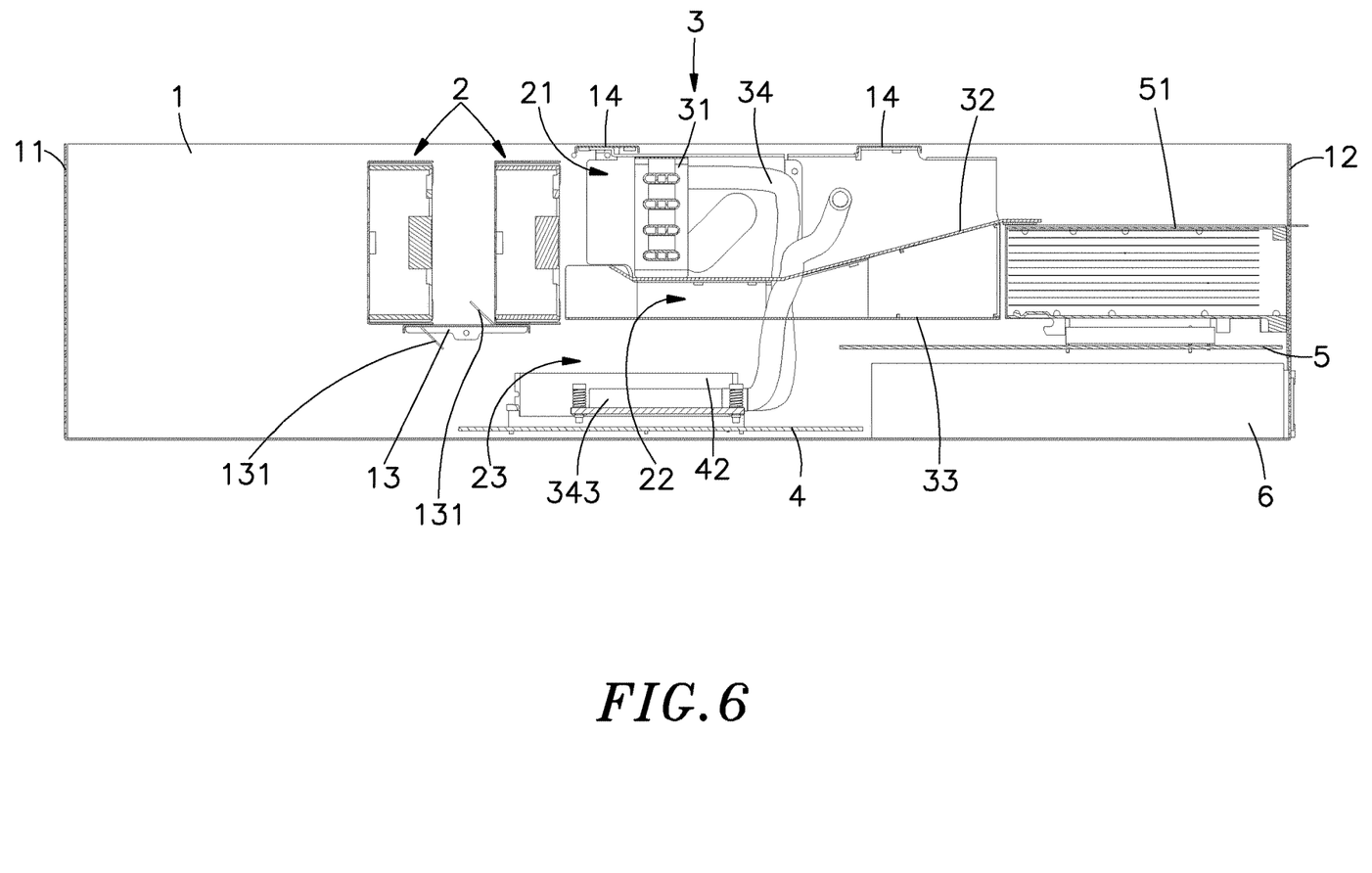
FIG. 6 is a sectional side view of the present invention, illustrating the air flowing direction from the air inlet of the cabinet to the air outlet.

Referring to FIGS. 5 and 6, the operation flow of the 3D extended cooling mechanism is outlined hereinafter. The air intake module 2 draws outside air into the cabinet 1 to form a cold air stream. Most of the cold air stream directly enters the first wind tunnel 21 and the second wind tunnel 22, and a small portion of the cold air stream between the air intake modules 2 on the two sides of the wind guide 13 is guided by the oblique guide plates 131 of the wind guide 13 downward into the third wind tunnel 23. A portion of the cold air stream flowing in the second wind tunnel 22 through the bottom plate 33 of the heat exchange module 3 flows downwardly through the diversion hole 330 into the third wind tunnel 23. Thus, the cold air stream flows in the first, second and third wind tunnels (21,22,23) to form a heat dissipation flow field. The second wind tunnel 22 mainly performs air cooling for the second heat source element 51. The third wind tunnel 23 mainly performs air cooling for the first heat source element 41, the memory module 42 and the third heat source element 6. However, since the heat generated by the first heat source element 41 (CPU) is not easily cooled by a single wind tunnel, the first heat source element 41 is connected to the thermal-conductive device 34, the heat exchangers 31 and the pumps 35, and thus, the high-temperature heat energy generated by the first heat source element 41 can be transferred from the heat transfer medium (which may be pure water or a composite water-cooled liquid) in the thermal-conductive device 34 to the heat exchanger 31 for heat exchange. The heat exchanger 31 is cooled by the cold air stream of the first wind tunnel 21. The cold heat transfer medium output from the heat exchanger 31 is then transmitted back to the first heat source element 41 through the thermal-conductive device 34 to reduce the operating temperature of the first heat source element 41. Thus, the first, second and third wind tunnels (21,22,23) expand longitudinally, the cold air stream of the second wind tunnel 22 is transversely cut and guided toward the second heat source element 51 for heat dissipation to achieve three-dimensional expansion cooling.

By the disclosure of the above FIGS. 1-6, the present invention can be understood as a 3D extended cooling mechanism. The 3D extended cooling mechanism comprises a cabinet, an air intake module and at least one heat exchange module. The heat exchange module comprises a heat exchanger, an air baffle and a bottom plate. A first wind tunnel is formed above the air baffle. A second wind tunnel is formed between the air baffle and the bottom plate. A third wind tunnel is formed between the bottom plate and the bottom of the cabinet. The first, second and third wind tunnels accept the air drawn by the air intake module to form a respective cold air stream. The heat exchanger accepts the cold air stream of the first wind tunnel for heat exchange, enabling the hot air generated in heat exchange to be delivered to the air outlet of the cabinet for discharge. The first, second, and third wind tunnels are designed to dissipate the relatively low temperature airflow into the high temperature sensitive heat source components in the longitudinal direction and the lateral direction. The heat source elements can be efficiently dissipated at the same time to achieve three-dimensional expansion cooling. The invention can be applied to various electronic or mechanical devices with cooling and heat dissipation requirements, and has good heat dissipation efficiency, so a patent application is filed to seek patent protection.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. A 3D extended cooling mechanism for integrated server, comprising:
 a cabinet comprising an air inlet and an air outlet;
 an air intake module fixedly mounted in said air inlet of said cabinet to draw outside air into said cabinet;
 at least one heat exchange module fixedly mounted in said cabinet adjacent to said air intake module, each said heat exchange module comprising a heat exchanger, an air baffle and a bottom plate, said air baffle defining a first wind tunnel at a top side thereof, said air baffle and said bottom plate defining therebetween a second wind tunnel, said bottom plate defining with a bottom of said cabinet a third wind tunnel therebetween, said first wind tunnel, said second wind tunnel and said third wind tunnel accepting the air drawn by said air intake module to form a respective cold air stream, said heat exchanger accepting the cold air stream of said first wind tunnel for heat exchange to produce a hot air flow that flows to said air outlet of said cabinet for discharge;
 a first heat source element mounted on said bottom of said cabinet to accept the cold air stream of said third wind tunnel for cooling;
 a thermal-conductive device mounted between said first heat source element and said heat exchanger for enabling hot energy generated by said first heat source element to be carried by a heat transfer medium in said thermal-conductive device to said heat exchanger for heat exchange for enabling a low-temperature heat transfer medium outputted by said heat exchanger to be guided by said thermal-conductive device back to said first heat source element to reduce the operating temperature of said first heat source element;
 a second heat source element mounted in said cabinet to accept the cold air stream of said second wind tunnel for cooling, enabling the hot air flowing through said second heat source element to be guided to said air outlet of said cabinet for discharge; and
 a third heat source element mounted on said bottom of said cabinet to accept the air stream of said third wind tunnel flowing through said first heat source element for cooling, enabling the hot air flowing through said third heat source element to be guided to said air outlet of said cabinet for discharge.

2. The 3D extended cooling mechanism for integrated server as claimed in claim 1, wherein each said heat exchange module further comprises a pump connected with said thermal-conductive device, said pump having a connecting pipe connected to said heat exchanger, said pump being adapted for driving said heat transfer medium to flow in said pump, said thermal-conductive device and said heat exchanger to lower the operating temperature of said first heat source element.

3. The 3D extended cooling mechanism for integrated server as claimed in claim 1, wherein said heat exchange module further comprises a plurality of wind splitters mounted on each of said air baffle and said bottom plate to transversely cut the cold air stream of said second wind tunnel and to guide the cut cold air stream toward said second heat source element for heat dissipation.

4. The 3D extended cooling mechanism for integrated server as claimed in claim 1, wherein said bottom plate of said heat exchange module has at least one diversion hole for guiding a part of the cold air stream of said second wind tunnel to said third wind tunnel.

5. The 3D extended cooling mechanism for integrated server as claimed in claim 1, wherein said thermal-conductive device comprises two hollow thermal-conductive tubes and a thermal cover attached to said first heat source element, one said thermal-conductive tube being a cryogenic tube, the other said thermal-conductive tube being a high temperature tube, said two thermal-conductive tubes being adapted for guiding a liquid state of said heat transfer medium to flow.

6. The 3D extended cooling mechanism for integrated server as claimed in claim 1, wherein said heat exchanger is a plate-fin heat exchanger that define therein a plurality of flow paths for said heat transfer medium to flow in for heat exchange.

7. The 3D extended cooling mechanism for integrated server as claimed in claim 1, wherein said heat transfer medium consists of pure water or a composite component of water-cooled liquid.

8. The 3D extended cooling mechanism for integrated server as claimed in claim 1, wherein said cabinet comprises a wind guide therein for supporting said air intake module, said wind guide comprising at least one air guide hole and two oblique guide plates arranged at two opposite sides of said at least one air guide hole, said two oblique guide plates each presenting a guide angle or disposed parallel to each other, said two oblique guide plates being respectively extended from opposing top and bottoms surfaces of said wind guide and adapted for guiding the air drawn by said air intake module into said third wind tunnel.

9. The 3D extended cooling mechanism for integrated server as claimed in claim 8, wherein said air intake module is composed of a plurality of fans that are arranged in two rows at two opposite sides of said air guide holes of said wind guide.

10. The 3D extended cooling mechanism for integrated server as claimed in claim 1, wherein said cabinet further comprises at least one bracket therein for the hanging of said heat exchange module.

\* \* \* \* \*